US008472903B2

(12) United States Patent  
Tarte

(10) Patent No.: US 8,472,903 B2  
(45) Date of Patent: Jun. 25, 2013

(54) ENTERTAINMENT SYSTEMS WITH ENHANCED FUNCTIONALITY

(75) Inventor: Christopher Tarte, Roanoke, TX (US)

(73) Assignee: PACCAR Inc, Bellevue, WA (US)

( * ) Notice: Subject to any disclaimer, the term of this patent is extended or adjusted under 35 U.S.C. 154(b) by 440 days.

(21) Appl. No.: 12/710,961

(22) Filed: Feb. 23, 2010

(65) Prior Publication Data

US 2011/0207423 A1 Aug. 25, 2011

(51) Int. Cl.
H04B 1/18 (2006.01)
(52) U.S. Cl.
USPC ..... 455/186.1; 455/130; 455/145; 455/150.1; 455/154.2
(58) Field of Classification Search
USPC .................. 455/566, 130, 145, 150.1, 154.2, 455/158.1, 161.1, 175.1, 179.1, 185.1, 186.1
See application file for complete search history.

(56) References Cited

U.S. PATENT DOCUMENTS

| | | | |
|---|---|---|---|
| 7,054,601 B2 | 5/2006 | Heiderscheit | |
| 7,171,174 B2 | 1/2007 | Ellis | |
| 7,343,141 B2 | 3/2008 | Ellis | |
| 7,487,252 B2 | 2/2009 | Vossler | |
| 7,548,197 B2 | 6/2009 | Gruchala | |
| 2003/0097477 A1 | 5/2003 | Vossler | |
| 2004/0116088 A1 | 6/2004 | Ellis | |
| 2004/0137866 A1 | 7/2004 | Miyamura | |
| 2004/0198282 A1 | 10/2004 | Heiderscheit | |
| 2005/0020223 A1 | 1/2005 | Ellis | |
| 2006/0284766 A1 | 12/2006 | Gruchala | |
| 2008/0319640 A1* | 12/2008 | Fujita et al. | 701/200 |
| 2009/0023406 A1 | 1/2009 | Ellis | |
| 2010/0285763 A1* | 11/2010 | Ingrassia et al. | 455/185.1 |

FOREIGN PATENT DOCUMENTS

| | | |
|---|---|---|
| JP | 4035227 A | 2/1992 |
| JP | 7202641 A | 8/1995 |
| KR | 2000-0033661 A | 6/2000 |

* cited by examiner

*Primary Examiner* — Tuan Pham  
(74) *Attorney, Agent, or Firm* — Christensen O'Connor Johnson Kindness PLLC

(57) ABSTRACT

An entertainment systems having enhanced functionally and methods therefor are provided. Embodiments of the system allow an operator to assign multiple groups of radio stations to the radio station presets of the system according to different geographical regions located along a calculated route. As the system travels along the calculated route, the radio station presets of the system are updated to correspond to the present location of the system.

12 Claims, 5 Drawing Sheets

| | REGION 1 | REGION 2 | REGION 3 | • • • | REGION N |
|---|---|---|---|---|---|
| PRESET 1 | 104.9 MHz | 1400 KHz | 101.7 MHz | • • • | 101.7 MHz |
| PRESET 2 | 99.1 MHz | 97.3 MHz | 95.1 MHz | • • • | 95.1 MHz |
| PRESET 3 | 93.3 MHz | 103.7 MHz | 1340 KHz | • • • | 1340 KHz |
| ⋮ | ⋮ | ⋮ | ⋮ | | ⋮ |
| PRESET N | 950 KHz | 1170 KHz | 106.9 MHz | | 1600 KHz |

*Fig.4.*

ENTERTAINMENT SYSTEMS WITH ENHANCED FUNCTIONALITY

BACKGROUND

Most car radios have an electronic tuner with multiple radio station presets. Typically, a user stores a radio station under a desired preset by tuning to a desired station and then pressing and holding the desired preset button for a short period of time until some form of confirmation (e.g., an audible "beep") indicates that the radio has stored the station under that preset. In most radios, each preset can store, at most, only one station per band—i.e., one AM station and one FM station.

When traveling from one geographical area to another (e.g., during a business trip, vacation, intercity commercial delivery, etc.), a driver loses the convenience of his preset stations. The driver goes out of range of a preset station, and stations begin to fade, necessitating manual tuning. When the driver reaches his destination away from home, he has the option of re-programming the radio presets, but this has the disadvantage of erasing his previously stored stations (i.e., those corresponding to his hometown) such that, when the driver returns home from his trip, he must go through the entire process of programming the presets again. This is very inconvenient, especially for drivers, such as commercial truck drivers, who frequently travel out of the area in which their favorite stations are receivable.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In accordance with aspects of the present disclosure, a system is provided that comprises a radio recevier having a group of radio station presets, a location acquisition unit that obtains location data, at least one input device for inputting groups of radio station frequency data, and a memory that stores a calculated route having a plurality of defined geographic regions and the plurality of groups of radio station frequency preset data. Each group of radio station frequency preset data is associated with one geographic region of the plurality of geographic regions along the calculated route. The system further includes at least one controller that monitors the location data from the location acquisition unit, selects a group of radio station frequency preset data based on current location data obtained from the location acquisition unit, and assigns the group of radio station frequency preset data to the group of radio station presets.

In accordance with another aspect of the present disclosure, a method is provided in an environment of an entertainment system having a plurality of current radio station presets. The method includes obtaining a calculated navigational route from a start location to an end location, assigning at least first and second regions to the calculated navigational route, each region defined by a boundary, receiving from operator input two or more radio station frequencies for each region, and assigning the radio station frequencies associated with the first region to the current radio station presets, wherein the first region is indicative of the current location of the system.

In accordance with an embodiment of the present disclosure, the aforementioned method may also monitor the current location of the entertainment system, and if the current location of the entertainment system changes from the first region to the second region, the method reassigns the current radio station presets to radio station frequencies associated with the second region.

DESCRIPTION OF THE DRAWINGS

The foregoing aspects and many of the attendant advantages of the disclosed subject matter will become more readily appreciated as the same become better understood by reference to the following detailed description, when taken in conjunction with the accompanying drawings, wherein:

FIG. 4 is one example of a radio preset table stored in memory; and

DETAILED DESCRIPTION

Figure 1:
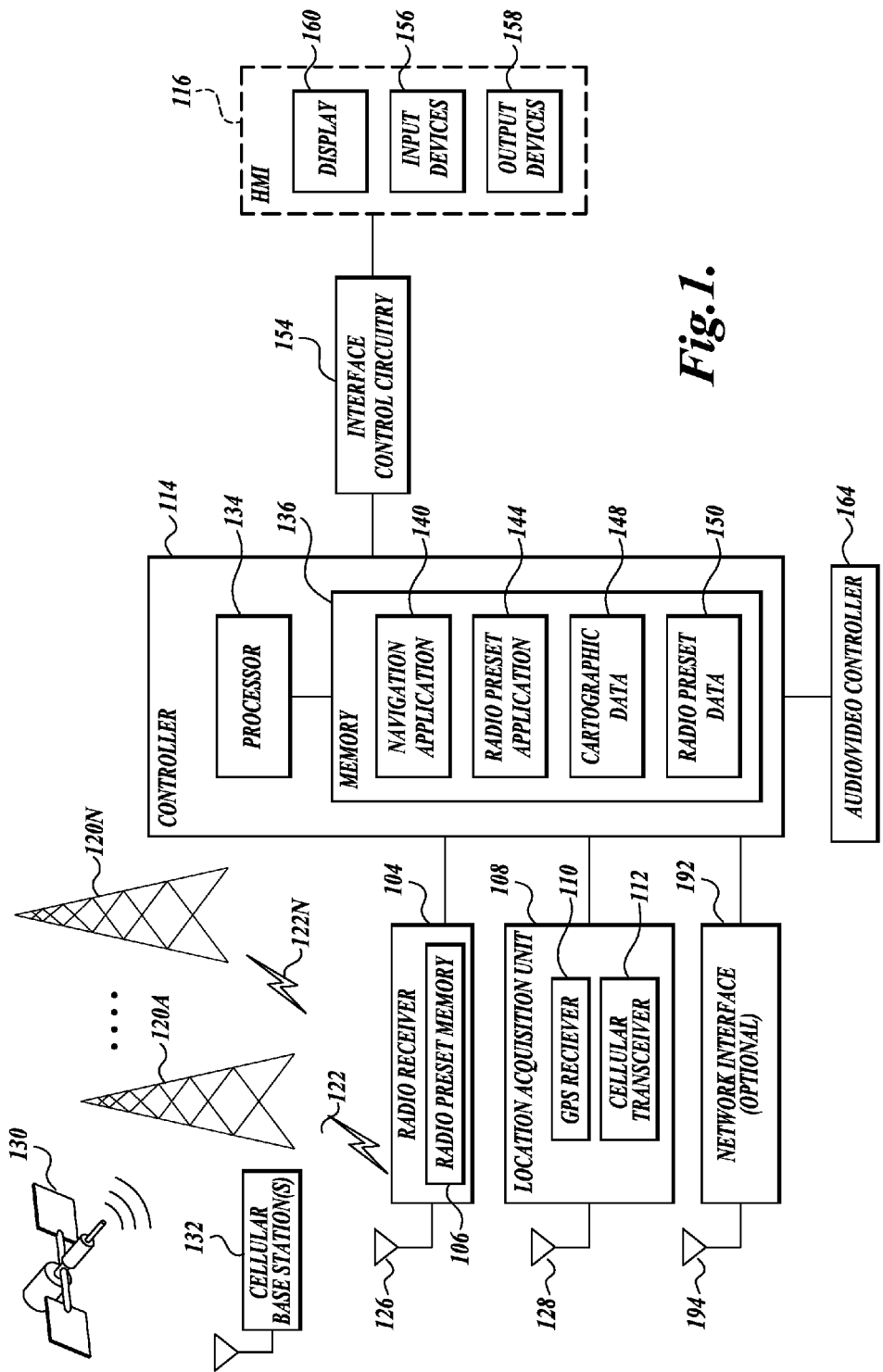
FIG. 1 is a functional block diagrammatic view of one embodiment of an entertainment system formed in accordance with aspects of the present disclosure.

The detailed description set forth below in connection with the appended drawings where like numerals reference like elements is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result.

The following discussion proceeds with reference to examples of entertainment systems, such as AM/FM radios, navigation integrated stereos, infotainment systems, etc., with enhanced features. Several examples of the present disclosure are directed to entertainment systems that employ GPS or other location data to increase functionality of the system. It will be appreciated that aspects of the disclosed subject mater have wide application, and therefore, may be suitable for use with any type of vehicle, such as passenger vehicles, buses, light, medium, and heavy duty vehicles, boats, yachts, motor homes, etc. Additionally, aspects of the disclosed subject matter may be suitable for use in portable entertainment devices, such as portable radios, laptop computers, cell phones, portable navigation integrated radios, etc. Accordingly, the following descriptions and illustrations herein should be considered illustrative in nature, and thus, not limiting the scope of the claimed subject matter.

Prior to discussing the details of various aspects of the present disclosure, it should be understood that several sections of the following description are presented in terms of logic and operations that may be performed by conventional electronic components. These electronic components, which may be grouped in a single location or distributed over a wide area, generally include processors, memory, storage devices, display devices, input devices, etc. It will be appreciated by one skilled in the art that the logic described herein may be implemented in a variety of configurations, including but not limited to, analog circuitry, digital circuitry, processing units, etc., and combinations thereof. In circumstances were the components are distributed, the components are accessible to each other via communication links.

In the following description, numerous specific details are set forth in order to provide a thorough understanding of exemplary embodiments of the present disclosure. It will be apparent to one skilled in the art, however, that many embodiments of the present disclosure may be practiced without some or all of the specific details. In some instances, well-known process steps have not been described in detail in order not to unnecessarily obscure various aspects of the present disclosure.

Turning now to FIG. 1, there is shown one exemplary embodiment of an entertainment system 100 formed in accordance with aspects of the present disclosure. As shown in FIG. 1, the entertainment system 100 includes a radio receiver 104, a location acquisition unit 108, a controller 114 for controlling components of the system, and a human machine interface (HMI) 116 for exchanging information between the operator and the other components of the system 100. As will be described in more detail below, embodiments of the system 100 allow an operator to assign multiple groups of radio stations to the radio station presets of the system 100 according to different geographical regions located along a calculated route. As the system 100 travels along the calculated route, the radio station presets of the system 100 are updated to correspond to the present location of the system 100.

Still referring to FIG. 1, the components of the entertainment system 100 will now be described in more detail. As best shown in FIG. 1, the system 100 includes a radio receiver 104 that is configured for receiving wireless analog and/or digital transmission signals from a plurality of radio stations 120A-120N over wireless links 122A-122N. The plurality of radio stations 120 can include, without limitation, commercial radio stations, AM radio stations and sub-carriers, FM radio stations and sub-carriers, short-wave radio, and the like.

The radio receiver 104 may include one or more components, such as a tuning circuit, a high frequency/intermediate frequency amplifying circuit, a detecting or demodulating circuit, and the like, for carrying out the functions of the radio receiver. In one embodiment, the radio receiver 104 may also include a radio station preset memory 106 for storing a current group of radio station frequencies that correspond, for example, to the operator's desired radio stations. As will be described in more detail below, the group of radio station frequencies stored in radio station preset memory 106 are linked to radio station preset input devices, such as buttons, virtual icons, etc., such that when a radio station preset input is selected, it causes the radio receiver 104 to tune to the corresponding radio station frequency, which is broadcasted by the desired radio station, such as one of the radio stations 120. If the operator wishes to listen to another preset radio station, the user selects another radio station preset button, actuates an up/down selector that scrolls through the radio preset stations, etc. In another embodiment, the radio station preset memory 106 may be located at controller 114.

It will be appreciated that the radio receiver 104 may be implemented in analog circuitry for receiving analog radio station transmission signals at a selected frequency, processing (e.g., detecting or demodulating, etc.) the transmission signals to extract audio media content (e.g., songs, sports talk, weather, etc.), and routing the audio media content under control of the controller 114 to the HMI 116 for output to the operator. Alternatively, the radio receiver 104 may be implemented in digital circuitry or a combination of analog and digital circuitry for receiving either analog or digital radio station transmission signals, processing the transmission signals to extract the audio media content, and providing the media content to the operator via the HMI 116. In another embodiment, the functionality of the radio receiver 104 may be carried out as a software defined radio (SDR) either located at the radio receiver 104 or implemented by the controller 114. To receive the analog or digital transmission signals, the radio receiver 104 is communicatively connected to an antenna 126.

The entertainment system 100 also includes a location acquisition unit 108 configured for obtaining transmission signals that can be used to determine the location (two dimensional, i.e., latitude and longitude, or three dimensional, i.e., latitude, longitude, and altitude) of the system 100. In one embodiment, the location acquisition unit 108 includes a GPS receiver 110 that determines the geographic location of the system 100 using global positioning system satellites 130. In another embodiment, the location acquisition unit 108 alternatively or additionally includes a cellular transceiver 112 that determines the geographic location of the system using cellular transmissions from cellular base stations 132. To receive global positioning system satellite transmissions or cellular base station transmissions, the location acquisition unit 108 is communicatively connected to at least one appropriate antenna 128.

The location acquisition unit 108 is coupled with the controller 114 for providing information and data to the controller 114 to enable the controller 114 to determine the geographic location of the system 100. Alternatively, the location acquisition unit 108 may include various processing and memory elements, including one or more processors or memory elements, to determine the geographic location of the system 100. In other embodiments, geographic information may be obtained from other sources such as the human machine interface 116 or through internal data stored within the system 100.

The system 100 also includes the controller 114 for obtaining data from the radio receiver 104, the location acquisition unit 108, and/or the human machine interface 116, and for carrying out the functionality of the system 100. In the embodiment shown in FIG. 1, the controller 114 includes a processor 134 communicatively connected to memory 136. In this regard, the processor 134 is configured to execute instructions and to carry out operations defined in applications, program modules, etc., that reside in the memory 136.

As used herein, controllers, control units, control modules, etc., can contain logic for carrying out general or specific operational features of the system 100. The logic can be implemented in hardware components, such as analog circuitry, digital circuitry, processing units, or combinations thereof, or software components having instructions which can be processed by the processing units, etc. Therefore, as used herein, the term "controller" can be used to generally describe these aforementioned components, and can be either hardware or software, or combinations thereof, that implement logic for carrying out various aspects of the disclosed subject matter.

Still referring to FIG. 1, the memory 136 is coupled with the processor 134 and/or other systems elements, as desired, and is operable to store various data utilized by the processor 134 and/or other elements. The memory 136 may include volatile and non-volatile and removable and non-removable memory, implemented in any method or technology capable of storing information, such as computer-readable instructions, data structures, program modules, tables/arrays, records or other data, etc. By way of example, the memory 136 may include, but is not limited to, random access memory (RAM), read only memory (ROM), flash memory, electrically erasable programmable ROM (EEPROM), flash memory, CD-ROM, digital versatile disks (DVD) or other optical disk storage, magnetic cassettes, magnetic tape, magnetic disk storage or other magnetic storage, or any other medium that can be used to store information for access by the processor 134.

Figure 2:
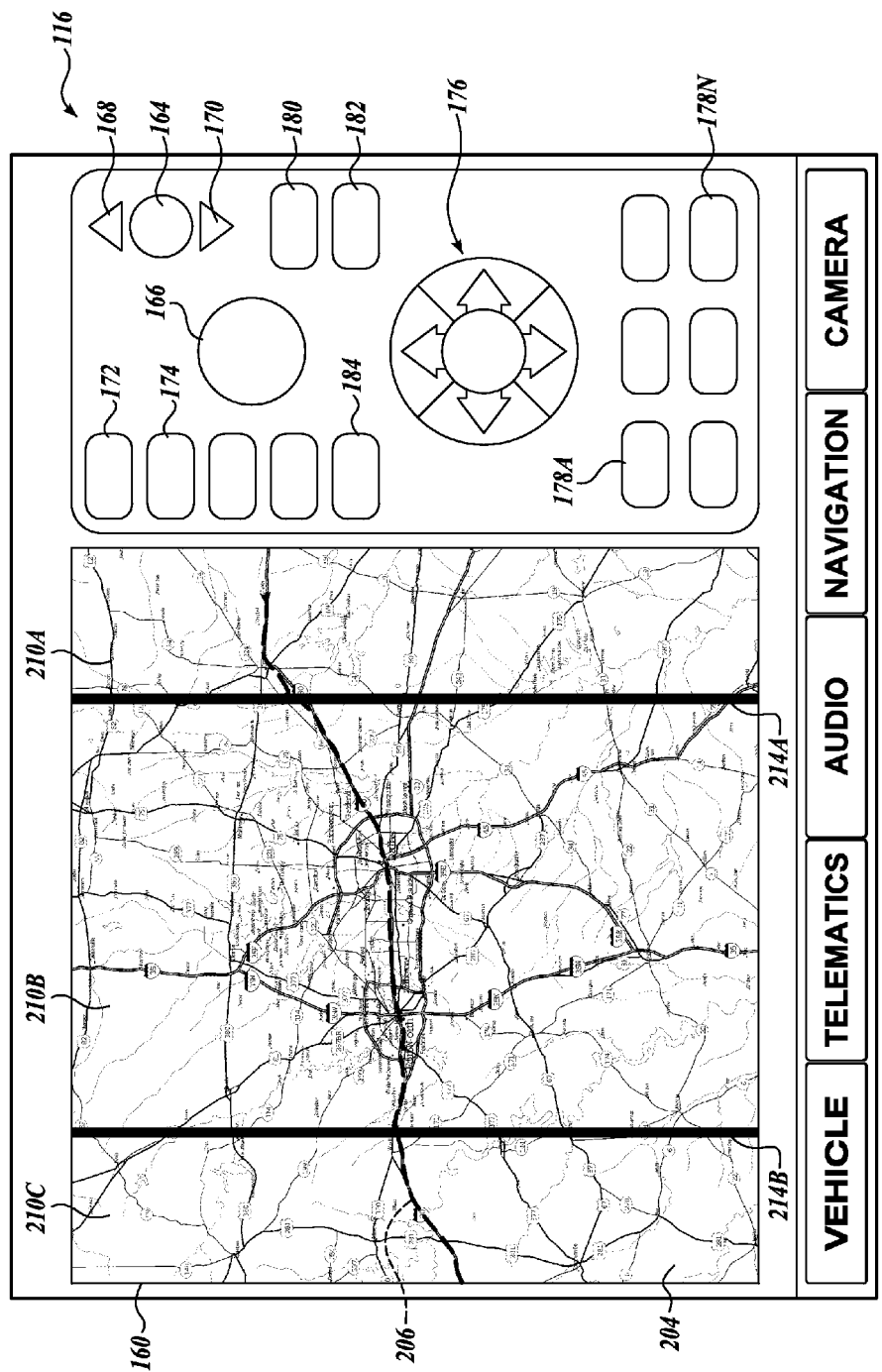
FIG. 2 is an example of a human machine interface in accordance with one embodiment of the disclosed subject matter, which is suitable for use with the entertainment system of FIG. 1.

In the embodiment shown in FIG. 1, the memory 136 stores a navigation application 140 that includes program logic for generating navigation maps for display by the HMI 116. Additionally, the application 140 includes program logic for calculating a route in response to operator input of start/end locations (e.g., addresses, latitude/longitude data, etc.). FIG. 2 illustrates one example of an HMI 116 displaying a navigation map 204 and a calculated route 206. Returning to FIG. 1, the memory 136 also stores various cartographic data 148 corresponding to thoroughfares, routes, terrain, and other general navigation data to facilitate the various navigation functions provided by the system 100, including route calculation. Additionally, the memory 136 may include stored destinations, destination addresses, and previously calculated or otherwise acquired routes to various destinations or destination addresses for later retrieval by the processor 134.

In the embodiment shown in FIGS. 1-2, the memory 136 also stores a radio preset application 144 that includes program logic that when executed, implements one or more steps of the methods described in more detail below. In particular, at the beginning of a trip, the radio preset application 144 obtains a calculated route, such as calculated route 206, from the navigation application 140 or memory 136 and divides the calculated route into two or more regions, such as regions 210A-210C, either automatically or via operator input. After the calculated route is divided into a plurality of regions, the application 144 stores location data that is associated with or defines each delineated region. The application 144 then receives operator inputted groups of radio station frequencies that are associated with each of the plurality of regions, stores the groups of radio station frequencies for subsequent retrieval by the processor 134, and causes the radio station frequencies associated with the system's current region (i.e., determined by the system's current location) to be loaded into the radio station preset memory 106. As the system 100 travels along the calculated route, the application 144 monitors the current location of the system 100 via data from the location acquisition unit 108. When the system 100 transitions from one region to the next, the radio station presets are automatically updated by loading the group of radio station frequencies associated with the new region into the radio station preset memory 106. One example routine implemented by the radio preset application 144 will be discussed in detail below with regard to FIG. 5.

The memory 136 further stores radio preset data 150. The radio preset data 150 can include pre-stored, historical, and/or acquired data, including look-up tables of the operator's favorite radio stations located in a particular broadcast area. Additionally, the radio preset data 150 can include data inputted by the operator via the HMI 116 and stored in memory 136. For example, the memory 136 may include radio preset data in the form of one or more memory arrays or tables that associate a group of radio station frequencies entered by the operator via the HMI 116 with a number of radio station preset inputs and a plurality of regions located along the calculated route. Turning to FIG. 4, there is shown one example of a radio station preset table 400 that can be generated and stored in memory 136. In the embodiment shown in FIG. 4, the table 400 can include a plurality of memory locations 404 that can store data, such as a radio station frequencies 408, corresponding to Preset 1 through Preset N and Region 1 through Region N. Each radio station frequency 408 includes the transmission frequency of the desired radio station such that the radio receiver 104 can tune to the desired radio station. In a further embodiment, each memory location can store a record that can include but is not limited to a radio station frequency, an acceptable signal strength value, radio station identification means such as call letters, etc.

The system 100 further includes a human machine interface (HMI) 116 communicatively connected to the controller 114 via interface control circuitry 154. The HMI 116 includes a plurality of input devices 156 or components, such as switches, buttons, knobs, levers, etc., for operating the system 100. The HMI 116 also includes output devices 158 or components, such as one or more light emitting diodes (LEDs), speakers, and the like. The HMI 116 further includes a display 160, such as a liquid crystal display (LCD), a light emitting polymer display (LPD), or the like, for displaying content (e.g., maps, calculated routes, radio station characteristic data, such as call letters, signal strength, and the like, etc.) to the operator.

In one embodiment shown in FIG. 2, the input devices 156 of the HMI 116 includes an ON/OFF controller knob 164, a tuning knob 166, volume control buttons 168 and 170, seek and scan buttons 172 and 174, a scroll wheel 176, a plurality of tuner preset buttons 178A-178N, AM/FM buttons 180 and 182, and a radio preset program button 184. In that regard, the scroll wheel 176 is coupled with the processor 134 so that depressing the buttons of the scroll wheel 176 causes activation of menu items and selection of virtual buttons on display 160, selects controls, or otherwise interacts with graphical elements that are presented on the display 160 to provide input. In one embodiment, the scroll wheel 176 can interact with a virtual QWERTY keyboard or alphanumeric keypad displayed on the display 160 for inputting names, addresses, or locations of start/end destinations, radio stations or radio station frequencies, etc., using any combination of the letters, numbers or symbols which are available on the keyboard or keypad.

In one embodiment, the radio station preset buttons 178A-178N are also coupled with the processor 134 and linked to the group of radio station frequencies stored in radio station preset memory 106 so that depressing the buttons 178A-178N causes radio receiver 104 to tune to the desired radio stations associated therewith, such as radio stations 120A-120N. The radio preset program button 184 is further coupled to the processor 134 so that depressing the button 184 launches the radio preset application 144. Further, the HMI 116 may include wired or wireless data transfer elements such as removable Flash memory, network connections, data transceivers, etc., to enable the user and other devices or parties to remotely interface with the system 100.

In one embodiment, the display 160 may also be configured as an input device for receiving commands from the operator to be processed by the controller 114. In one embodiment, the display 160 may include a touch sensitive layer on the screen that is configured to receive input from the user. In typical embodiments, the touch sensitive layer is configured to recognize a user's touches applied to the surface of the layer. For example, the position of the touches, the pressure of the touches, general direction of the touches, and the like are recognized by the touch sensitive layer. In one embodiment, the functionality of one or more inputs devices (e.g., seek/scan, volume control, radio preset buttons, radio preset program button, etc.) can be carried out by icons presented by the touch screen display and activated by an operator's finger, a stylus, etc. In another embodiment, the operator may interact with the virtual keyboard or keypad displayed on the display 160 via a finger, stylus, etc.

Thus, the HMI 116 enables the operator and the system 100 to exchange information. For example, the HMI 116 can be used to enter data, to request and display content, such as navigation information, radio data, and audio/video content, to play audio or provide audible directions, among others. As those skilled in the art will appreciate, the HMI 116 outlined above is meant to be representative and to not reflect all possible components of an HMI that may be employed. In embodiments where the entertainment system 100 is mounted within a vehicle, the input devices can be positioned in any well known location, such as on the steering wheel and/or the dash, as best shown in FIG. 3.

Figure 3:
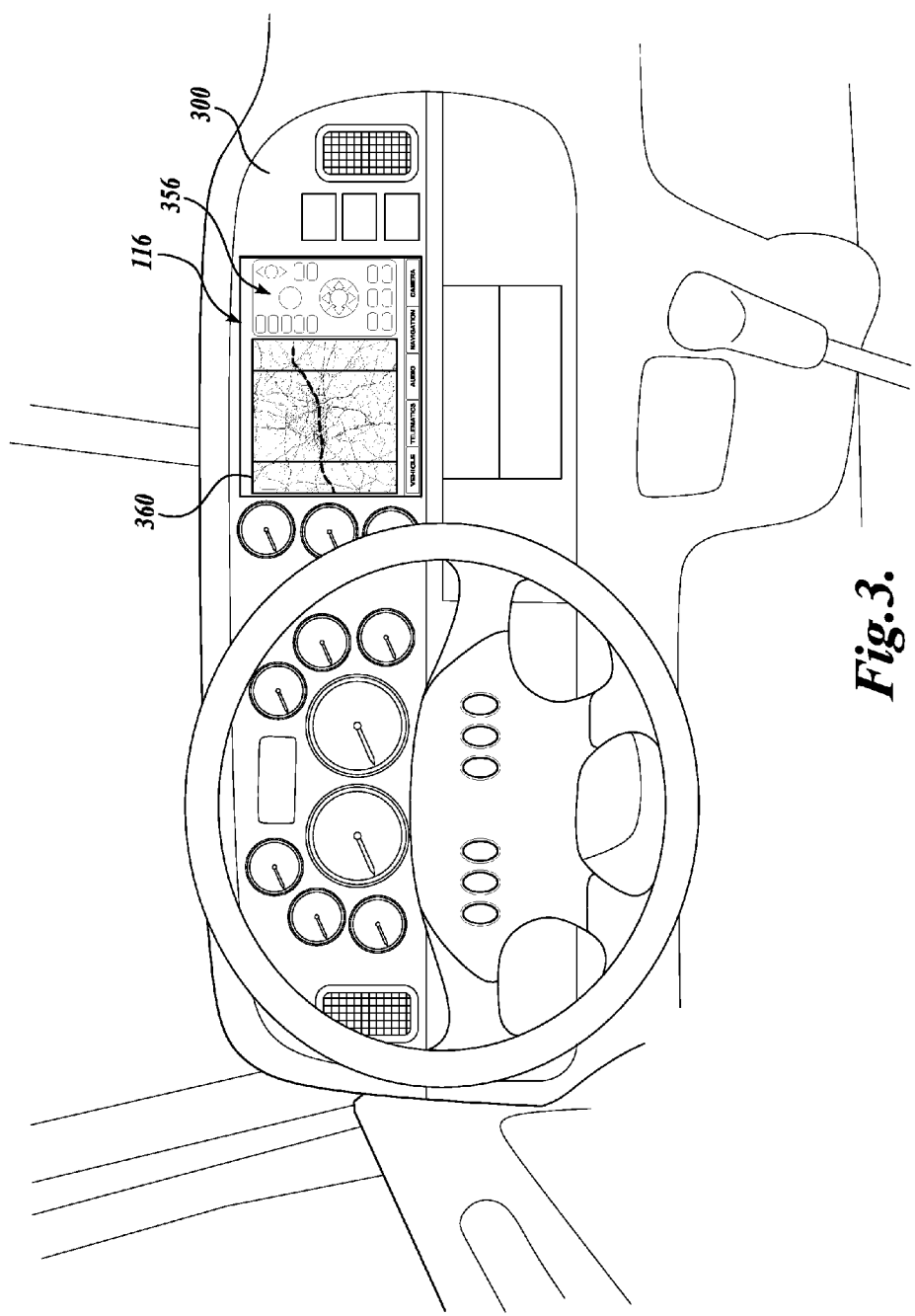
FIG. 3 is a schematic diagram depicting the human machine interface of FIG. 2 mounted within the dash of a vehicle.

With reference now to FIG. 3, an exemplary implementation of the HMI 116 is shown mounted and integrated in a vehicle. In one embodiment, the HMI 116 is mounted in a vehicle console 300 at a location that may be accessed by a vehicle operator and/or vehicle passenger. In this regard, the HMI 116 includes a display 360 which utilizes controls and graphics to display information and obtain input from the user. Accordingly, a user may activate menu items, click buttons, select controls, or otherwise interact with graphical elements that are presented on the display 360 to provide input. The HMI 116 also depicts one or more input devices 356, such as buttons, scroll wheels, knobs, etc., mounted adjacent to the display 360.

Returning to FIG. 1, the system 100 may also include an audio/video controller 164 that is capable of converting digital video and audio content into a format compatible for being disseminated to a user via the human machine interface 116. In one embodiment, the controller 164 may employ one or more codecs to process the video and/or audio data, as needed. For example, when a video stream is received, the controller decodes the stream and presents the decoded video on the display 160. Similarly, an incoming digital audio stream may be processed by the controller for playing the decoded audio data through appropriate output devices, such as speakers. While the audio/video controller 164 is shown as a separate component in FIG. 1, one or more functions of the device may be alternatively implemented at the controller 114, radio receiver 104, and/or location acquisition unit 108, etc.

The system 100 may further include an optional network interface 192 for communicating with other devices or networks using wired or wireless communication protocols. The network interface 192 may include communication circuitry that permits wired communication over a LAN via Ethernet protocols (IEEE 802.3) or wireless communication over one or more wireless networks via IEEE 802.11/IEEE 802.16 protocols, cellular protocols (e.g., CDMA, TDMA, WCDMA, OFDM) etc.), etc. It should be understood that the network interface 192 may comprise other components, including transmitter/receiver or transceiver circuitry for performing communications using the above-identified protocols. By way of example only, these components may include but are not limited to a cellular radio or modem, a Bluetooth interface, satellite communication interface, RF communication interface, etc. To communicate wirelessly, the network interface 192 may include antenna 194.

Figure 5:
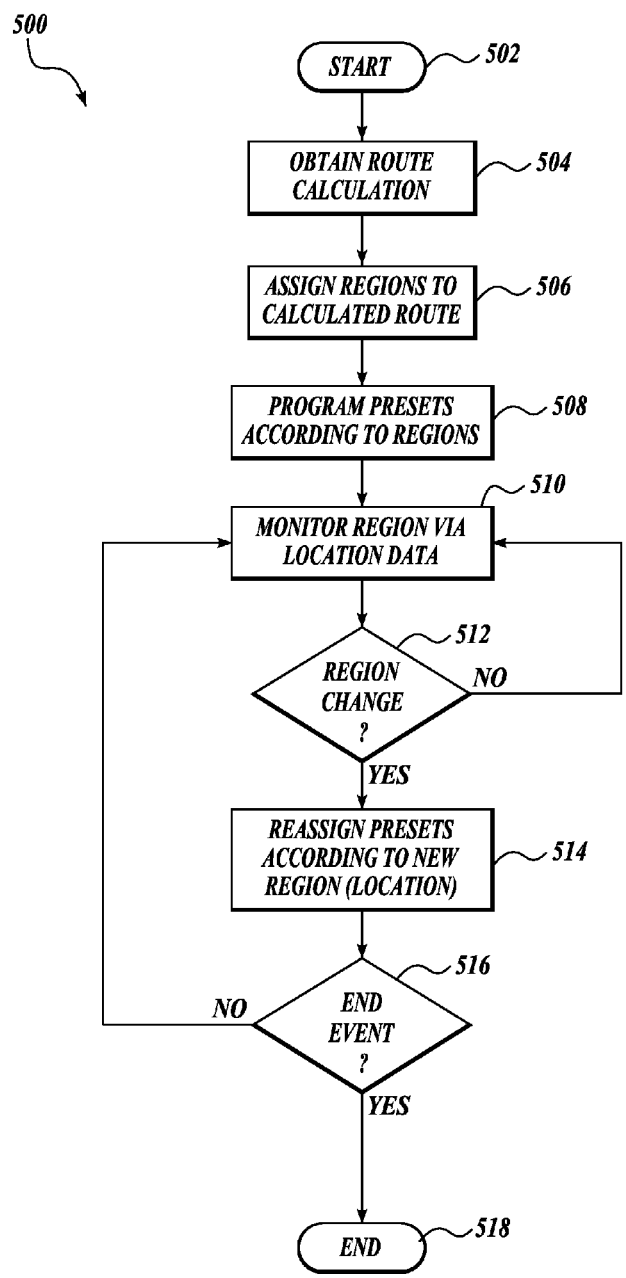
FIG. 5 is a flow diagram of one exemplary method implemented by the entertainment system in accordance with aspects of the present disclosure.

Referring now to FIG. 5, there is shown a flow diagram of one exemplary radio preset routine 500 that may be carried out by the controller 114 via execution of one or more of applications, such as the navigation application 140 and the radio preset application 144. As described above, depression of the radio preset button 180 by the operator launches the radio preset application 144, which starts routine 500 at block 502. It will be appreciated that the application 144 can be launched prior to the start of a trip or subsequently thereafter.

From block 502, the routine 500 proceeds to block 504, where a calculated route for the current trip is obtained, such as route 206 shown in FIG. 2. For example, the operator may have employed the navigation application 140 to generate a route based on operator input of start/end locations for the current trip. Alternatively, the route may be obtained by retrieving a previously calculated route from the memory 136, or utilizing a user or third-party route provided through the HMI 116. If the route is not currently available from memory or from the navigation application 140, the application 144 can cause the navigation application to launch, prompt the operator for start/end locations for the current trip, and retrieve the route calculated by the navigation application 140. The route may be calculated utilizing any route generation method or algorithm known in the art. As known in the art, the calculated route generally includes a route through one or more thoroughfares to the destination and may be communicated to the user through the HMI 116 or stored within the memory 136. As visibly communicated to the operator, the calculated route 206 may be presented as a highlighted line, dashed line, etc., overlaying the map 204 on the display 160. The route may also be audibly communicated to the operator as directions via speakers.

Once a calculated route is obtained at block 504, the method proceeds to block 506, where two or more regions are assigned to the calculated route. For example, at block 506, the calculated route, such as route 206, can be divided or partitioned into a plurality of discrete geographic regions, such as regions 210A-210C. The regions may be defined, for example, by longitudinal boundary lines (as boundary bars 214), as best shown in FIG. 2, latitudinal boundary lines, or a combination of the two. The routine 500 may utilize various techniques or algorithms to generate regions from the calculated route. In one embodiment, the operator is prompted to divide the calculated route into discrete regions. The operator can use any input device 156 to achieve the desired result, including, for example, the scroll wheel 176 or the touch screen display 160. For example, the controller 114 may prompt the operator via the HMI 116 by displaying a number of boundary bars 214 to represent, for example, longitudinal boundary lines. The boundary bars 214 overlay the map 204 of the current trip and the calculated route 206, which are presented by the display 160. Then, the operator can use a finger, stylus, etc. in a "drag and drop" fashion, or can use the scroll wheel 176 to highlight and move the boundary bars 214 along the displayed map until positioned in a desired location. The controller 114 then saves in memory 136 the location data corresponding to the regions' boundary lines.

In an alternative embodiment, the radio preset application 144 can automatically divide the calculated route 206 in a plurality of regions 210, which can be defined on the display 160 by boundary bars 214. In one embodiment, the regions 210 may be calculated to represent equal segments (i.e., equal distance between the boundary lines) along the route. In another embodiment, the regions may be calculated to represent unequal segments (i.e., unequal distances) along the calculated route. For example, the application 144 may take geographic or other factors into consideration when assigning regions to the calculated route. In one embodiment, if the calculated route includes at least one metropolitan region, then the application 144 can divide the regions into uneven areas, in which the region containing the geographic factor (e.g., metro area) can represent, for example, a larger distance. Other factors may be utilized to alter the size of the regions, including topographical data (e.g., mountain ranges, valleys, tunnels, etc), weather data, etc, which may affect reception quality or the like. In yet another embodiment, the application 144 may access a look-up table stored in memory 136 or may use network interface 192 to obtain a pre-determined region allocation for a particular route.

Next, at block 508, the radio station presets are programmed according to the generated regions. For example, the controller 114 can prompt the operator via the display 160 or speakers to enter the groups of desired radio station frequencies 408, region by region, for the radio station preset buttons 178A-178N, virtual preset icons, etc. In one embodiment, the application 144 may present a list or menu of radio stations (by station call letters and/or frequencies) to the operator that are available (i.e., acceptable reception quality) within each region. The list or menu may be generated from data located in memory 136 or obtained through network interface 192. In another embodiment, the application 144 can attempt to verify the availability of the radio stations within each region via historically generated look-up tables, and the like.

Once entered, the radio station frequencies 408 are stored in a table, such as radio station preset table 400, according to radio Presets 1 through N and Regions 1 through N. After the table 400 is stored in memory 136, the group of radio station frequencies associated with the system's current region (i.e., determined by current location data from the location acquisition unit 108), such as region 210A (i.e., region 1), are loaded into the radio station preset memory 106. Such radio station frequencies can be referred to hereinafter as "current radio station frequencies." As such, when a radio station preset input, such as radio station preset 178A, is depressed, it causes the radio receiver 104 to tune to the corresponding current radio station frequency saved in the radio station preset memory 106 for receiving transmission signals broadcasted by a radio station, such as one of the radio stations 120. If the operator wishes to listen to another radio station by tuning into another current radio station preset frequency, the user depresses another radio station preset button, such as 178B, actuates an up/down selector of the scroll wheel 176 that scrolls through the current radio preset station frequencies, etc.

After the radio station presets are programmed at block 508, the routine 500 proceeds to block 510, where location data indicative of current system location is monitored. For example, as the system 100 travels along the calculated route of the current trip between the start and end locations, location data obtained by the location acquisition unit 108 and processed, for example, by the processor 134, is monitored continuously or in predetermined intervals (e.g., 1 second, 1 minute, 10 minutes, etc.). At block 512, a test is carried out to determine whether the system 100 is currently located in a "new" or different region than previously determined. For example, the controller 114 can compare the current location of the system 100 with the established location boundaries of each region stored in memory 136. If the test determines that the region has changed (e.g., from region 210A (region 1) to region 210B (region 2)), the routine 500 proceeds to block 514, otherwise the routine returns to block 510.

At block 514, which indicates the current location of the system 100 corresponds to a different region than previously determined, the radio preset inputs, such as buttons 178A-178N, are reassigned based on the data in table 400 by loading the group of radio station frequencies associated with the new region into the radio station preset memory 106. For example, if the region has changed from Region 1 to Region 2, the radio station preset button for Preset 1 (e.g., 178A) changes from 104.9 MHz to 1400 KHz. Similarly, the radio station preset button for Preset 2 (i.e., 178B) changes from 99.1 MHz to 97.3 MHz, and so on.

After the radio station preset inputs, e.g., buttons, icons, etc., have been reassigned at block 514, the operator can tune into his favorite radio stations in that region depending on which radio station preset input, such as buttons 178A-178N, is depressed. The routine 500 continues until an end event has occurred. The end event can include but is not limited to a new route or detour being calculated by the operator or if the system 100 reaches the end destination of the calculated route. The routine 500 ends at block 518.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the claimed subject matter.

The invention claimed is:

1. A system, comprising:
    a radio receiver having a group of radio station presets;
    a location acquisition unit configured to obtain location data;
    at least one input device configured to input groups of radio station frequency data;
    a memory configured to store a calculated route, data indicative of boundaries defining a plurality of discrete geographic regions located along said calculated route, and the groups of radio station frequency data as a plurality of groups of radio station frequency preset data, each group of radio station frequency preset data associated with one geographic region of the plurality of discrete geographic regions located along the calculated route; and
    at least one controller configured to monitor the location data from the location acquisition unit, select a group of radio station frequency preset data based on current location data obtained from the location acquisition unit, and assign said group of radio station frequency preset data to the group of radio station presets.

2. The system of claim 1, wherein the location acquisition unit includes a GPS receiver.

3. The system of claim 1, further comprising a display for displaying the calculated route.

4. The system of claim 3, further comprising at least one input device linked to the groups of radio station frequency preset data.

5. The system of claim 4, wherein the input device is a depressible button.

6. The system of claim 4, wherein the display is a touch screen display and wherein the input device is a virtual icon displayed by the display.

7. A system, comprising:
    a radio recevier having a group of radio station presets;
    a location acquisition unit configured to obtain location data;
    at least one input device configured to input groups of radio station frequency data;

a memory configured to store a calculated route and the groups of radio station frequency data as a plurality of groups of radio station frequency preset data; and at least one controller configured to:
   obtain the calculated route;
   partition the calculated route into a plurality of discrete geographic regions based in part on the calculated route;
   associate each group of radio station frequency preset data with one geographic region of the plurality of geographic regions along the calculated route;
   monitor the location data from the location acquisition unit;
   determine the current geographic region of the system from the plurality of geographic regions based on the location data; and
   assign the group of radio station frequency preset data associated with the determined geographic region to the group of radio station presets.

8. The system of claim 7, wherein the calculated route is partitioned based on operator input.

9. The system of claim 7, wherein the plurality of discrete geographic regions are each defined by a boundary.

10. The system of claim 9, wherein the boundary comprises at least one longitudinal boundary line.

11. The system of claim 9, wherein the boundary comprises at least one latitudinal boundary line.

12. The system of claim 9, wherein the boundary comprises at least one of a latitudinal boundary line and a longitudinal boundary line.

* * * * *

UNITED STATES PATENT AND TRADEMARK OFFICE
CERTIFICATE OF CORRECTION

PATENT NO.       : 8,472,903 B2  
APPLICATION NO.  : 12/710961  
DATED            : June 25, 2013  
INVENTOR(S)      : C. Tarte Page 1 of 1

It is certified that error appears in the above-identified patent and that said Letters Patent is hereby corrected as shown below:

Title Page, Item (57), Abstract, column 2, line 1, "An entertainment systems" should read --An entertainment system--

Title Page, Item (57), Abstract, column 2, line 1, "enhanced functionally" should read --enhanced functionality--

In the Specification

Column 1, line 39, "recevier" should read --receiver--

Column 2, line 51, "subject mater" should read --subject matter--

In the Claims

Column 10, line 30 (Claim 1, line 2), "recevier" should read --receiver--

Signed and Sealed this  
Seventh Day of January, 2014

Margaret A. Focarino  
*Commissioner for Patents of the United States Patent and Trademark Office*